(12) United States Patent
Hashii et al.

(10) Patent No.: US 6,465,328 B1
(45) Date of Patent: Oct. 15, 2002

(54) SEMICONDUCTOR WAFER MANUFACTURING METHOD

(75) Inventors: Tomohiro Hashii, Imari; Kazunori Onizaki, Saga Prefecture; Sumihisa Masuda, Imari, all of (JP)

(73) Assignee: Sumitomo Metal Industries, Ltd., Osaka (JP)

( * ) Notice: Subject to any disclaimer, the term of this patent is extended or adjusted under 35 U.S.C. 154(b) by 0 days.

(21) Appl. No.: 09/806,199

(22) PCT Filed: Sep. 29, 1999

(86) PCT No.: PCT/JP99/05311

§ 371 (c)(1),
(2), (4) Date: Mar. 27, 2001

(87) PCT Pub. No.: WO00/21122

PCT Pub. Date: Apr. 13, 2000

(30) Foreign Application Priority Data

Oct. 1, 1998 (JP) .............................................. 10-279667

(51) Int. Cl.$^7$ ........................... H01L 21/46; H01L 21/30
(52) U.S. Cl. ......................................... 438/459; 438/928
(58) Field of Search ................................. 438/113, 459, 438/460, 690, 691, 692, 928, 974

(56) References Cited

U.S. PATENT DOCUMENTS 6,162,730 A * 12/2000 Kai et al. .................. 438/690

* cited by examiner

Primary Examiner—David Nelms
Assistant Examiner—David Nhu
(74) Attorney, Agent, or Firm—Breiner & Breiner, L.L.C.

(57) ABSTRACT

An edge-rounded portion mirror finishing process, which results in low deformation on a wafer, which has undergone a slicing process including a grinding process in which double-sided grinding is performed on the. sliced wafer; a finishing grinding process in which high-precision and low-deformation finish grinding is performed on the wafer; an edge rounding process in which low-deformation grinding is performed on an edge-rounded portion of the wafer; a two-sided primary polishing process in which primary polishing is performed on both sides of the edge-rounded wafer; a one-sided finish polishing process in which finish polishing is performed on one side of the wafer that has been primary polished on both sides; and a process in which finish polishing is performed on the edge-rounded portion of the above-mentioned wafer.

5 Claims, 1 Drawing Sheet

SEMICONDUCTOR WAFER MANUFACTURING METHOD

FIELD OF INVENTION

The present invention relates to a manufacturing method, which produces a semiconductor wafer of high flatness, and low process deformation from a single crystal ingot. For example, this manufacturing method comprises a process, wherein a wafer is sliced from a single crystal ingot, then subjected to surface grinding and finish grinding on both sides at the same time, undergoes low-deformation edge rounding using a fixed abrasive, polished on both sides simultaneously, and is subjected to edge-rounded polishing, after which it is finish polished again on one side. That is, the present invention relates to a manufacturing method, which performs low deformation grinding and polishing of an edge-rounded portion between surface grinding and polishing, and produces a high-precision semiconductor wafer, with high flatness, and low process deformation required by large-diameter quality wafers, making it possible to enhance yields in the device process.

BACKGROUND OF THE INVENTION

In general, a semiconductor wafer manufacturing method comprises the following processes.
1) A slicing process, which produces a thin, disc-shaped wafers by slicing a single-crystal ingot pulled by a single-crystal pulling apparatus;
2) An edge rounding process for preventing the wafer chipping and cracking;
3) A lapping process for planarizing a wafer that has undergone edge rounding;
4) An etching process, which removes a process deformed layer generated on a wafer by the above-mentioned processing;
5) An edge-rounded portion polishing process, which finish polishes the edge-rounded portion;
6) A polishing process, which polishes the above-mentioned wafer on either one side or both sides; and
7) A process, which finish polishes the above-mentioned wafer.

In the past, in the above-mentioned etching process, acid etching was performed. However, this acid etching made it difficult to maintain the flatness achieved via the lapping process, and because of the abundant waste liquid in the treatment processes of both etching and lapping, there were numerous environmental issuesas well.

Accordingly, with an object of doing away with the lapping process and etching process, and eliminating such waste liquid treatment, there has been proposed (Japanese Patent Laid-open No. 6-177096) a method for surface grinding each side of a wafer following slicing.

Further, with an objective of reducing the manufacturing process time, reducing polishing costs (quantity), and enhancing wafer flatness, there has been proposed (Japanese Patent Laid-open No. 8-316180) a method, which after slicing, subjects a wafer to edge rounding, two-sided surface grinding, and then uses chemical polishing to finish the wafer. And with the same objective, there has been proposed (Japanese Patent Laid-open No. 9-248740) a method, which after slicing, subjects a wafer to two-sided surface grinding, performs etching as needed to remove residual deformation, and then uses chemical polishing to finish both sides of the wafer.

Furthermore, with an objective of simplifying the wafer manufacturing process, and enhancing wafer flatness, there has been proposed (Japanese Patent Laid-open No. 9-260314, Japanese Patent Laid-open No. 9-270396) a method, which after slicing, subjects a wafer to edge rounding and one-sided surface grinding, performs etching as needed to remove residual deformation, washes the wafer, and then uses chemical polishing to finish both sides of the wafer. Also there has been proposed (Japanese Patent Laid-open No. 9-260314) a method, which after slicing, subjects a wafer to edge rounding, one-sided surface grinding, lapping, then after performing dry etching, uses chemical polishing to finish both sides of the wafer.

As described above, a variety of manufacturing methods have been proposed with an objective of solving problems related to waste liquid treatment for etchants and lapping agents, and for reducing processing time and also polishing costs when manufacturing semiconductor wafers.

However, even with the above-mentioned proposals, in methods, in which an end rounding process is performed after the slicing process, because the thickness of the sliced wafers varies, the bevel width varies over the entire wafer perimeter, causing yields to drop in the fabrication process.

Further, in methods, in which a lapping process and two-sided surface grinding process are carried out following an edge rounding process, there is the danger that the edge-rounded portion of a wafer will be scratched by the inner wall of the carrier, and at the same time, because of the different thickness of the wafers being processed, a wafer will collide with a carrier during grinding, causing the edge-rounded portion to be chipped and damaged, and causing the loss of the cross-sectional shape of the edge-rounded portion.

SUMMARY OF THE INVENTION

With the foregoing problems of wafer manufacturing methods in view, it is an objective of the present invention to attempt to increase the precision of a wafer by incorporating a low-deformation grinding process into the wafer manufacturing process. Further, an objective of the present invention is to provide a novel high-precision semiconductor wafer manufacturing method, which is capable of reducing total materials costs, and especially, which enables the realization of the high degree of flatness and low process deformation required by large-diameter wafers, and enhances yields in the device process.

The inventors undertook a variety of studies concerning grinding and polishing processes, having as an objective the realization of a high degree of flatness and low process deformation in a semiconductor wafer, and enhance yields in the device process. As a result, the inventors learned that it is possible to achieve the above-mentioned objective in a semiconductor wafer manufacturing method. A wafer is sliced from a single crystal ingot, mirror polished on a required side by performing a surface grinding process of various processes, followed by applying a mirror finish process of various processes for making the edge-rounded portion of a wafer a mirror finish with low deformation. Then finally finish polished on a required main side of an edge-rounded wafer.

Further, the inventors learned that various processes can be applied. Such as, 2-stage processes to each of the above-mentioned surface grinding process, an edge-rounded portion mirror finish process, and a process for mirror finish polishing a required main surface, which are employed in the process of the present invention. Furthermore, the inventors brought the present invention to completion based on the knowledge that it is possible to achieve the above-mentioned object more efficiently by interposing an edge-rounded portion grinding and polishing process between the surface grinding process and the process for mirror finish polishing a required main surface.

DETAILED DESCRIPTION OF PRESENTLY PREFERRED EMBODIMENTS

Figure 1:
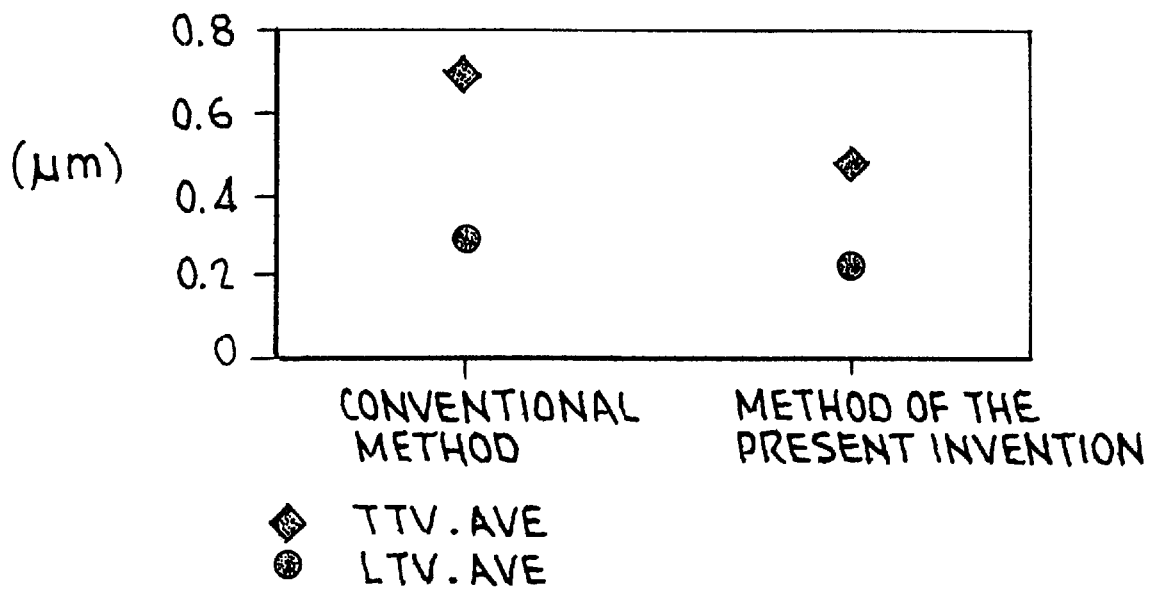
FIG. 1 is a graph comparing wafer flatness in accordance with a conventional method and the method of the present invention.

The present invention is a semiconductor wafer manufacturing method, in which a wafer is sliced from a single crystal ingot, a required surface is finished to a mirror finish. However, this method is characterized in that it introduces an edge-rounded portion mirror finishing process, which mirror finishes with low deformation to the edge-rounded portion of a wafer.

With the present invention, it is possible to utilize in the above-mentioned surface grinding process either process: (a) comprising a grinding process which performs double-ended grinding, and a finish grinding process which finish grinds either one side or two sides of a wafer with high precision and low deformation, or; (b) comprising a finish grinding process which finish grinds both sides of a wafer with high precision and low deformation, and then an alkaline washing process.

With the present invention, it is possible to utilize in the abovementioned edge-rounded portion mirror finishing process, or; (c) comprising an edge-rounding process (c-1) which performs grinding with low deformation, and an edge-rounded portion polishing process (c-2) which performs finish polishing, or; (d) comprising a mirror finish polishing of a single or plurality of stages.

Further, setting to 2~3 $\mu$m the process deformed layer of the entire surface of a wafer following the low-deformation finish grinding of a surface and edge-rounded portion, does not allow a process deformed layer to remain behind following a finishing process of a subsequent process.

With the present invention, it is possible to utilize a process, comprising a two-sided primary polishing process (e), which performs primary polishing of both sides of a wafer, and a one-sided finish polishing process (f), which finish polishes one side of a wafer that has been primary polished on both sides.

With the present invention, after the slicing process, it is possible to efficiently manufacture a semiconductor wafer of high flatness and high precision by performing processes in the order of a grinding process (a), which performs double-ended grinding of both sides of a wafer, an edge rounding process (c-1), which performs low-deformation grinding of the edge-rounded portion of a wafer. Then a two-sided primary polishing process (e), which performs primary polishing on both side of a wafer, an edge-rounded portion polishing process (c-2), which finish polishes the edge-rounded portion of a wafer. Thereafter a one-sided finish polishing process (f), which finish polishes one side of a wafer.

With the present invention, simultaneously grinding or polishing a plurality of wafers, and making the thickness of all the wafers fall within a required range prior to carrying out edge rounding processing, makes it possible to improve processing precision by making the bevel width uniform, and to reduce the generation of particles in the device process, thus enabling improved yields.

With the present invention, performing edge rounding after carrying out double-ended grinding and/or two-sided polishing, during which it is possible for the wafer peripheral portion to come in contact either with other wafers or a carrier or other kind of apparatus, prevents damage to the edge-rounded portion, making it possible to reduce particle generation in the device process, and enabling improved yields.

The slicing process either produces a thin disc-shaped wafer by slicing a single crystal ingot using the inner diameter of a cutting blade, or produces a wafer using an apparatus called a wire saw by bringing a moving thin wire in contact with and slicing a single crystal ingot while applying a grinding slurry. To lessen the load on the grinding process, it is desirable that a wafer be sliced with extremely high flatness, and good surface roughness.

Because the thickness of the wafers vary when a wafer is planarized by lapping, bevel width variations are generated in the edge-rounding process, leading to decreased yields. Accordingly, double-ended grinding is performed with an objective of finishing with good thickness precision and flatness for a wafer produced by a slicing process. That is removing the waviness on a wafer produced by slicing, and removing the process deformed layer produced by slicing.

With the present invention, double-ended grinding can make the depth of the process deformed layer of the surface of a wafer less than 10 $\mu$m. It is also capable of removing the waviness on a wafer produced at slicing, by performing grinding on both sides of a wafer simultaneously with a fixed abrasive without using a free abrasive. A grinding wheel with a particle size of around #325~#3000 can be utilized, and as the diamond bonding agent for making a fixed abrasive, a metal, vitrified, or resin bonding agent can be utilized as the abrasive bond.

The double-ended grinding process makes use of a vertical double-ended grinding apparatus, which disposes between an upper grinding wheel and a lower grinding wheel a carrier capable of holding one or a plurality of wafers. The upper and lower grinding wheels are rotated at high speed by separate and independent drive mechanisms, enabling double-ended grinding to be performed on sliced wafers (not yet edge rounded), which are held in a carrier that rotates at low speed. A single wafer-type apparatus, which performs double-ended grinding on a single wafer that is not held in a carrier, can also be used.

In the finish grinding process, since it is possible to make the depth of the process deformed layer of the surface of a wafer around 2~3 $\mu$m, and it is also possible to make the total thickness variation (TTV) less than 1 $\mu$m by using a fine fixed abrasive. Therefore the etching process, which is effective at removing the process deformed layer, can be omitted. Thus enabling the prevention of wafer precision deterioration resulting from etching. A grinding wheel with particle size of around #2000~#8000 can be used, and a metal, vitrified, or resin bonding agent can be utilized as the abrasive bond.

Further, because the finish grinding process enables the provision of a high precision wafer to the subsequent two-sided primary polishing process and the one-sided finish polishing process, production costs can be greatly reduced. Also, the omitting the lapping process and the etching process also enables industrial wastes to be reduced.

For the finish grinding process, it is possible to utilize a constitution, wherein single wafer grinding is performed in accordance with a highly rigid vertical surface grinding apparatus. For example, a structure, in which there is disposed a rotating table, which is rotated at high speed by a drive mechanism. Also grinding wheels can be utilized, which are rotated at high speed by a drive mechanism, they are disposed above and below the above-mentioned table so as to be able to move close to and away from. It is also possible to utilize a constitution, wherein a ceramic plate is provided on a rotating table, and grinding is performed by vacuum clamping a wafer using a vacuum chuck.

The two-sided primary polishing process is performed for the purpose of removing the process deformed layer generated by the above-mentioned grinding process; while maintaining the flatness of the wafer, which was planarized in the above-mentioned grinding process. Pressurized polishing is performed by supplying a polishing slurry, and using a polishing cloth comprising urethane foam. The particle size of the polishing slurry is not especially limited, e.g., and a colloidal silica, with a particle size of between 10~270 nm can be utilized.

An example of an apparatus that can be used in the two-side primary polishing process constitutes, for example, upper and lower plates having polishing pads and being disposed opposite one another. The lower plate being equipped with a sun gear in the center, an internal gear on the outer side, and a geared carrier being held between these gears. In accordance therewith, the carrier, holding a plurality of wafers and sandwiched between the polishing pads of the upper and lower plates, is autorotated and made to revolve. Hence, enabling the two-sided polishing of the wafers by the application of pressure from the upper plate.

Further, the one-sided finish polishing process can make use of a constitution, wherein single-wafer polishing is performed using the same constitution as the above-mentioned highly rigid vertical polishing apparatus. For example, it is possible to use a constitution, wherein an upper plate having a polishing pad is rotated at high speed, and is capable of applying pressure to the upper surface of a rotating table, which is also rotated at high speed. The rotating table is equipped with a ceramic plate, and polishing is performed by vacuum clamping a wafer in a vacuum chuck. It is possible to use the same polishing pad and polishing slurry as that utilized in the two-sided primary polishing process.

In the past, because heavy grinding was performed in the edge-rounding process, the grinding caused the process deformed layer to penetrate deep within a wafer, so that an edge-rounded portion polishing process alone could not remove the process deformed layer. Thus constituting the need for an etching process. Accordingly, after performing either a double-ended grinding process or a two-sided primary polishing process, in which processing can be carried out by either holding a wafer in a carrier or by holding a wafer by another method, it is possible to manufacture wafers with uniform bevel widths. It is also possible to prevent the loss of the cross-sectional shape of the edge-rounded portion resulting from contact with a carrier or the like. This is achieved by finishing the edge of a wafer with high precision and low deformation, using a fine fixed abrasive in a low deformation edge-rounding process, which performs soft grinding that is gentle on an edge-rounded portion.

The low-deformation edge-rounding process can make use of a constitution, which enables the vacuum clamping of a wafer by a vacuum chuck. Also at the peripheral portion of a rotating table, which is rotated at high speed, a grinding wheel for peripheral grinding and a grinding wheel for notch grinding, which are rotated at high speed, making it possible to perform soft grinding. A grinding wheel particle size of around #325~#6000 can be used, and a metal, vitrified, or resin bonding agent can be utilized as the abrasive bond.

As described above, by carrying out soft grinding in a low-deformation edge-rounding process, the diametric depth of the process deformed layer can be made 2~3 μm. Therefore the roughness of the edge can be finished favorably, and an extremely smooth edge can be achieved using a subsequent edge finish polishing process alone.

The edge finish polishing process, in a constitution that is the same as the above-mentioned edge polishing apparatus, for example, can make use of a constitution; which disposes at the peripheral portion of a low speed rotating table and a high speed polishing cloth-equipped buff. Thus making it possible to achieve a smooth edge.

In low-deformation edge rounding and edge-rounded portion polishing, it is possible to use a method in which polishing is carried out at a prescribed pressure while supplying a polishing slurry to a polishing cloth-equipped buff. A colloidal silica with a particle size of between 20~300 nm, for example, can be utilized as the polishing slurry.

EXAMPLE 1

A wafer manufacturing method according to the present invention was implemented using the following conditions. That is, in the slicing process (A), a single-crystal silicon ingot pulled using a single-crystal pulling apparatus was sliced in a certain fixed direction, and finished to a thin disc-shaped wafer.

Next, for the purpose of satisfactorily finishing a wafer to a precise thickness and flatness, removing the slicing-induced waviness from a wafer surface, and removing the process-deformed layer generated during slicing, double-ended grinding is performed using a double-ended grinding process (B), which grinds up to 50 μm from both sides of a wafer. The method used was one, in which diamond cup-type wheels were utilized in the upper and lower grinding wheels. Furthermore, grinding was carried out at a prescribed cutting speed while supplying a grinding agent to the upper and lower grinding wheels.

A low-deformation edge-rounding process (C) was performed on a wafer that had undergone this double-ended grinding. As for the conditions of low-deformation edge rounding, horizontal grinding wheels were utilized in the peripheral grinding wheel, and the notch grinding wheel. Furthermore grinding was carried out at a prescribed cutting speed while supplying a grinding agent to the peripheral grinding wheel and the notch grinding wheel. It was ascertained that an abrasive of between #325~#6000 can be utilized.

A wafer subjected to this double-ended grinding and low-deformation edge rounding was further planarized via a finish grinding process (D). As for the finish grinding conditions, a diamond cup wheel with a particle size #2000~#8000 was utilized. Grinding was performed at a prescribed cutting speed while supplying a grinding agent.

The above-mentioned wafer, which was planarized by finish grinding, was subjected to a subsequent two-sided primary polishing process (E). This removed the process-deformed layer of the surface of a wafer while maintaining flatness. As for the conditions of two-sided primary polishing, a polishing cloth comprising an urethane foam was mounted to the upper and lower plates, and polishing was performed under a prescribed pressure while supplying a polishing slurry having a colloidal silica particle size of between 10~270 nm to the upper and lower plates.

In the low-deformation edge-rounding process (F), after carrying out either a double-ended grinding process (B) or a two-sided primary polishing process (E), in which a wafer was held in a carrier, the edge of a wafer was finished with high precision and low deformation using a fine fixed abrasive. Subsequent thereto, an edge-rounded portion polishing process (G) was performed.

In low-deformation edge rounding and edge-rounded portion polishing, there was used a method, which utilized a #325~#6000 diamond abrasive horizontal grinding wheel in the peripheral grinding wheel and notch grinding wheel, and which carried out grinding at a prescribed cutting speed while supply a grinding agent thereto.

Following this edge-rounded portion polishing process (G), after undergoing a one-sided finish polishing process (H), a wafer with extremely high flatness was manufactured. One-sided finish polishing utilized a method, in which a polishing cloth comprising a urethane foam and a nonwoven fabric was mounted to a plate. Then polishing was performed under a prescribed pressure while supplying to the plate a polishing slurry based on a colloidal silica with a 10~270 nm particle size.

Comparison 1

The first example comprises (A) a slicing process, (B) a double-ended grinding process, (C) a low-deformation edge-rounding process, (D) a finish grinding process, (E) a two-sided primary polishing process, (F) a low-deformation edge-rounding process, (G) an edge-rounded portion polishing process, and (H) a one-sided finish polishing process. For comparison purposes, a wafer was manufactured having as a conventional process 1) a slicing process, 2) an edge-rounding process, 3) a lapping process, 4) an etching process, 5) an edge-rounded portion polishing process, 6) a one-side polishing process, and 7) a finish polishing process.

For those processes that were the same in both the first example and the conventional process, the same processing conditions were applied. Furthermore, the lapping process utilized a method in which a wafer was loaded into a carrier and sandwiched between an upper and a lower plate. Then processing was performed under a fixed pressure while supplying a free-abrasive slurry. The etching process utilized a method in which a wafer was immersed in an acidic solution, such as hydrofluoric acid, nitric acid, or acetic acid, to remove a damaged layer resulting from the lapping process.

Figure 2:
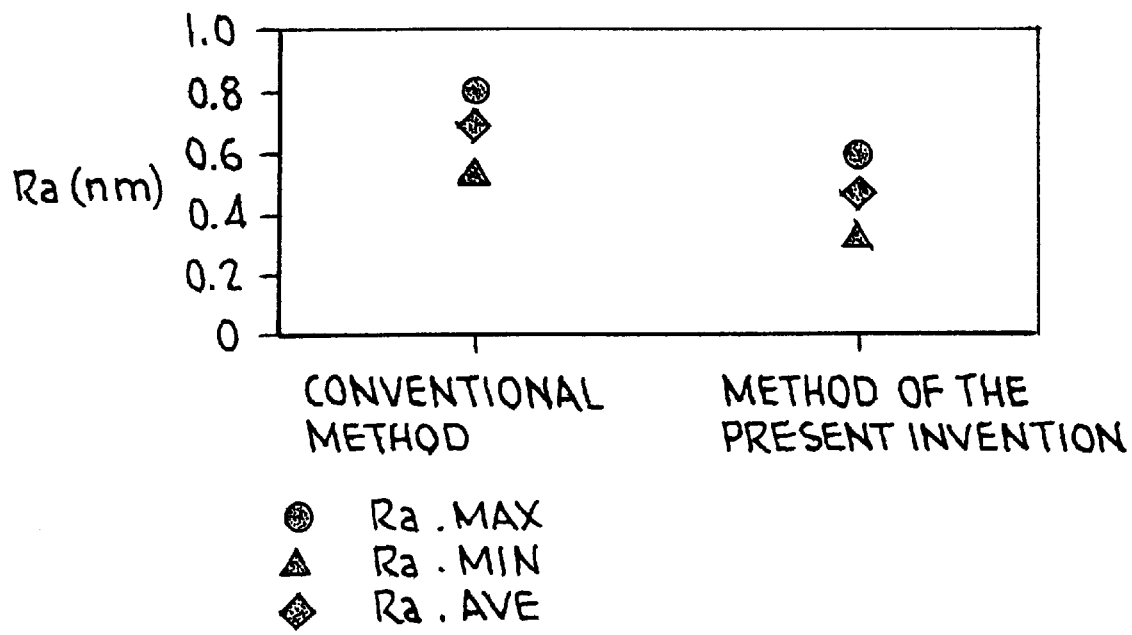
FIG. 2 is a graph comparing wafer surface roughness in accordance with a conventional method and the method of the present invention.

The flatness and surface roughness of the resulting wafers were measured, and the results thereof are shown in FIG. 1 and FIG. 2. Whereas flatness achieved with the conventional method was a TTV average (AVE) of 0.69 $\mu$m, and a local thickness variation (LTV) AVE of 0.29 $\mu$m, that achieved with the method of the present invention was a TTV AVE of 0.48 $\mu$m, and an LTV AVE of 0.21 $\mu$m. Further, compared to a surface roughness achieved with the conventional method of Ra MAX 0.79 $\mu$m, Ra MIN 0.54 $\mu$m, and Ra AVE 0.69 $\mu$m, that achieved with the method of the present invention was Ra MAX 0.58 $\mu$m, Ra MIN 0.32 $\mu$m, and Ra AVE 0.46 $\mu$m.

EXAMPLE 2

A wafer was manufactured using a process, which omitted the (F) low-deformation edge-rounding process in the first example, but kept all the other conditions the same. This second example confirmed that it is possible to achieve a wafer having the same levels of flatness and surface roughness as those of the first example.

EXAMPLE 3

A wafer was manufactured using a process, which reversed the order of the (C) low-deformation edge-rounding process and (D) finish grinding process in the second example to (D), (C), but kept all the other conditions the same as those in the first example. This third example confirmed that it is possible to achieve a wafer having the same levels of flatness and surface roughness as those of the second example.

EXAMPLE 4

A wafer was manufactured using a process, which omitted the (D) finish grinding process and the (F) low-deformation edge-rounding process in the first example, but kept all the other conditions the same. This fourth example confirmed that it is not possible to achieve the same levels of flatness and surface roughness as those of the first example, but is possible to achieve a wafer of higher precision than that of the conventional first comparative example.

What is claimed is:

1. A semiconductor wafer manufacturing method, in which a wafer is sliced from a single crystal ingot and a predetermined surface is finished to a mirror finish, comprising:

a grinding process which grinds simultaneously both sides of the wafer;

an edge-rounding process which grinds a rounded edge portion of the wafer with low deformation;

a two-sided primary polishing process which performs primary polishing of said both sides of the wafer;

a rounded edge portion polishing process which performs finishing polishing of the rounded edge portion of the wafer, and a one-sided finish polishing process which performs finish polishing on one side of the wafer.

2. The semiconductor wafer manufacturing method according to claim 1, further comprising a finish grinding process, which performs finish grinding with high precision and low deformation on ether one side or two sides of the wafer, between the grinding process and the two-sided primary polishing process.

3. The semiconductor wafer manufacturing method according to claim 1, wherein the edge rounding process follows the two-sided primary polishing process.

4. The semiconductor wafer manufacturing method according to claim 2, wherein following said finish grinding of the rounded edge portion and one side of the wafer, a deformed layer of the entire surface of the wafer is 2~3 $\mu$m.

5. The semiconductor wafer manufacturing method according to claim 1, wherein thickness of the wafer is provided within a predetermined range.

* * * * *

UNITED STATES PATENT AND TRADEMARK OFFICE
CERTIFICATE OF CORRECTION

PATENT NO. : 6,465,328 B1
DATED : October 15, 2002
INVENTOR(S) : Tomohiro Hashii et al.

It is certified that error appears in the above-identified patent and that said Letters Patent is hereby corrected as shown below:

<u>Title page,</u>
Item [75], Inventors, "Kazunori Onizaki, Saga Prefecture" should read -- Kazunori Onizaki, Kishima-gun --.
Item [57], ABSTRACT,
Line 4, "the. Sliced" should read -- the sliced --.

<u>Column 8,</u>
Line 48, "ether" should read -- either --.

Signed and Sealed this

Twenty-eighth Day of January, 2003

JAMES E. ROGAN
*Director of the United States Patent and Trademark Office*